(12) United States Patent
Zhou

(10) Patent No.: US 10,665,699 B2
(45) Date of Patent: May 26, 2020

(54) SEMICONDUCTOR STRUCTURE AND FABRICATION METHOD THEREOF

(71) Applicants: Semiconductor Manufacturing International (Shanghai) Corporation, Shanghai (CN); SMIC New Technology Research and Development (Shanghai) Corporation, Shanghai (CN)

(72) Inventor: Fei Zhou, Shanghai (CN)

(73) Assignees: Semiconductor Manufacturing International (Shanghai) Corporation, Shanghai (CN); SMIC New Technology Research and Development (Shanghai) Corporation, Shanghai (CN)

(*) Notice: Subject to any disclaimer, the term of this patent is extended or adjusted under 35 U.S.C. 154(b) by 0 days.

(21) Appl. No.: 16/117,956

(22) Filed: Aug. 30, 2018

(65) Prior Publication Data

US 2019/0097020 A1    Mar. 28, 2019

(30) Foreign Application Priority Data

Sep. 26, 2017    (CN) .......................... 2017 1 0885877

(51) Int. Cl.
| | |
|---|---|
| *H01L 21/762* | (2006.01) |
| *H01L 29/66* | (2006.01) |
| *H01L 29/49* | (2006.01) |
| *H01L 29/78* | (2006.01) |
| *H01L 29/08* | (2006.01) |

(Continued)

(52) U.S. Cl.
CPC .... *H01L 29/6681* (2013.01); *H01L 21/28088* (2013.01); *H01L 21/76224* (2013.01); *H01L 27/0886* (2013.01); *H01L 29/0653* (2013.01); *H01L 29/0847* (2013.01); *H01L 29/4966* (2013.01); *H01L 29/66545* (2013.01); *H01L 29/66636* (2013.01); *H01L 29/7848* (2013.01);

(Continued)

(58) Field of Classification Search
CPC ........... H01L 29/6681; H01L 29/66545; H01L 29/66636; H01L 29/76224; H01L 29/4966
See application file for complete search history.

(56) References Cited

U.S. PATENT DOCUMENTS

| | | | |
|---|---|---|---|
| 2016/0225674 A1* | 8/2016 | Jacob | H01L 21/823821 |
| 2016/0308027 A1* | 10/2016 | Chang | H01L 29/66795 |
| 2017/0162575 A1* | 6/2017 | Li | H01L 21/28088 |

* cited by examiner

*Primary Examiner* — Dale E Page
*Assistant Examiner* — Wilner Jean Baptiste
(74) *Attorney, Agent, or Firm* — Anova Law Group, PLLC

(57) ABSTRACT

A semiconductor structure and a method for fabricating the semiconductor structure are provided. The method includes providing a substrate including a functional region and a blank region; and forming one or more active fins on the functional region of the substrate, and one or more sacrificial fins on the blank region of the substrate. The method also includes forming a dummy gate structure, across length portions of each active fin and each sacrificial fin; and forming an interlayer dielectric layer to fill a gap between adjacent dummy gate structures. In addition, the method includes forming a gate opening in the interlayer dielectric layer by removing the dummy gate structure. Further, the method includes removing at least a portion of the sacrificial fin in the gate opening; and forming a gate structure in the gate opening after removing the portion of the sacrificial fin in the gate opening.

16 Claims, 9 Drawing Sheets

(51) Int. Cl.
*H01L 29/06* (2006.01)
*H01L 21/28* (2006.01)
*H01L 27/088* (2006.01)
*H01L 29/165* (2006.01)

(52) U.S. Cl.
CPC ........ *H01L 29/7851* (2013.01); *H01L 29/165* (2013.01)

SEMICONDUCTOR STRUCTURE AND FABRICATION METHOD THEREOF

CROSS-REFERENCES TO RELATED APPLICATIONS

This application claims the priority of Chinese patent application No. 201710885877.7, filed on Sep. 26, 2017, the entirety of which is incorporated herein by reference.

FIELD OF THE DISCLOSURE

The present disclosure generally relates to the field of semiconductor manufacturing and, more particularly, relates to a semiconductor structure and fabrication method thereof.

BACKGROUND

With the development of integrated circuit towards ultra-large scale integrated circuit, circuit density in the integrated circuit continues increasing, the number of components included in the integrated circuit continues increasing, and the size of the components decreases accordingly. With the decreasing of the size of metal-oxide-semiconductor (MOS) devices, channels of the MOS devices are shortened accordingly. Because the channel is shortened, the gradient channel approximation of the MOS devices is no longer valid, and varieties of adverse physical effects (especially the short-channel effect) become prominent. The device performance and reliability may degrade, which limits further reduction of the size of the devices.

To further reduce the size of the MOS devices, a multi-faceted-gate field effect transistor (FET) structure has been developed to improve the control capability of the gate on the MOS device, and to suppress the short-channel effect. Among them, a fin field effect transistor (FinFET) is one of common multifaceted-gate field effect transistors.

The FinFET has a three-dimensional structure. The FinFET includes a substrate, one or more protruding fins formed on the substrate, and an isolation structure disposed between adjacent fins. The FinFET also includes a gate electrode crossing the one or more fins and covering each of top and sidewall surfaces of the fins. Because the three-dimensional FinFET is significantly different from a conventional planar transistor, improper operations in some processes may cause a great impact on the electrical properties of the formed device.

A source region, a drain region, and a channel of the FinFET are formed in the fin, and, thus, the formation quality of the fin has an important influence on the performance of the semiconductor structure. However, the fins in the FinFET often have non-uniform height or width, thereby affecting the performance of the formed semiconductor structure. The disclosed methods and device structures are directed to solve one or more problems set forth above and other problems.

BRIEF SUMMARY OF THE DISCLOSURE

One aspect of the present disclosure includes a method for fabricating a semiconductor structure. The method includes providing a substrate including a functional region and a blank region and forming one or more active fins on the functional region of the substrate, and one or more sacrificial fins on the blank region of the substrate. The method also includes forming a dummy gate structure, across length portions of each active fin and each sacrificial fin; and forming an interlayer dielectric layer to fill a gap between adjacent dummy gate structures. In addition, the method includes forming a gate opening in the interlayer dielectric layer by removing the dummy gate structure. The gate opening exposes a portion of each of top and sidewall surfaces of the active fin, and a portion of each of top and sidewall surfaces of the sacrificial fin. Further, the method includes removing at least a portion of the sacrificial fin in the gate opening; and forming a gate structure in the gate opening after removing the portion of the sacrificial fin in the gate opening.

Another aspect of the present disclosure includes a semiconductor structure. The semiconductor structure includes a substrate including a functional region and a blank region. The semiconductor structure also includes one or more active fins on the functional region of the substrate, and one or more sacrificial fins on the blank region of the substrate, wherein a height of each sacrificial fin is lower than a height of each active fin. Further, the semiconductor structure includes a gate structure, on each active fin and each sacrificial fin, and across a length portion of the active fin.

Other aspects of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or the alike parts.

Figure 1:
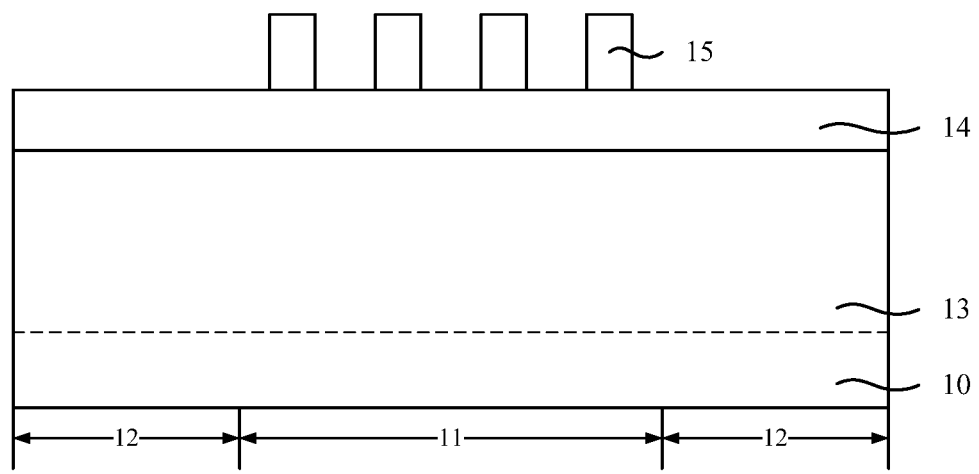
FIGS. 1-4 illustrate semiconductor structures corresponding to certain stages for forming a semiconductor structure.

FIGS. 1-4 illustrate semiconductor structures corresponding to certain stages for forming a semiconductor structure. Referring to FIG. 1, a substrate 10 is provided. The substrate 10 includes a first region 11 and a second region 12 disposed adjacent to the first region 11. A semiconductor structure formed on the first region 11 of the substrate 10 has one or more fins, while a semiconductor structure formed on the second region 12 of the substrate 10 does not have fin. A fin material layer 13 is formed on the substrate 10, and the fin material layer 13 is used to form the one or more fins after being etched.

Referring back to FIG. 1, a fin mask material layer 14 is formed over the substrate 10, and a plurality of discrete fin patterns 15 are formed on the fin mask material layer 14. Because the semiconductor structure formed on the first region 11 of the substrate 10 has the one or more fins, the plurality of fin patterns 15 are formed over the first region 11 of the substrate 10 and are not formed over the second region 12 of the substrate 10.

Figure 2:
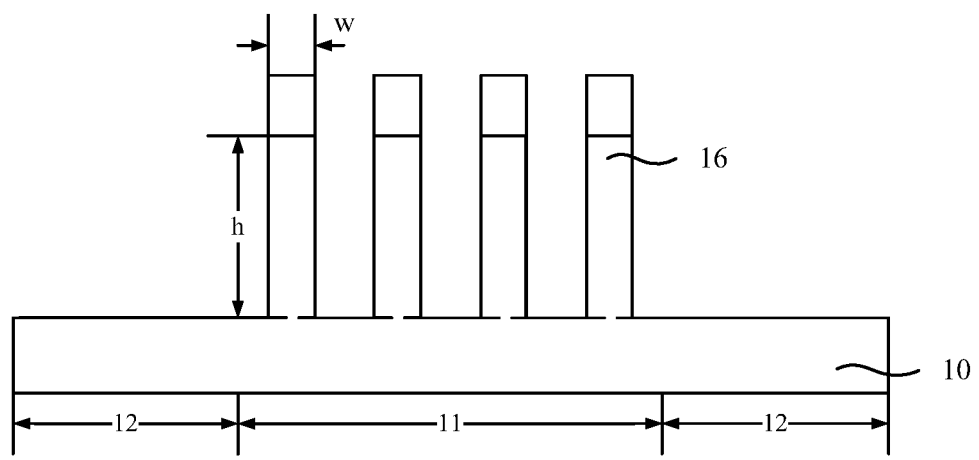

Referring to FIG. 2, one or more fins 16 protruding on the substrate 10 are formed by sequentially etching the fin mask material layer 14 and the fin material layer 13 using the plurality of fin patterns 15 as a mask.

As the integration degree increases, the device density increases, and the size of the device and a spacing between adjacent devices decrease accordingly. Thus, the size of the fin 16 and a spacing between adjacent fins 16 also decrease accordingly. Therefore, when forming the one or more fins 16, an etch loading effect of the etching process becomes prominent.

Referring back to FIG. 2, because fin is not formed on the second region 12, the fin patterns 15 are not formed over the second region 12. While, one or more fins have to be formed on the first region 11, thus, the fin patterns 15 are formed over the first region 11. Therefore, when etching the fin material layer 13 (illustrated in FIG. 1), an etch loading of the etching process on the fin material layer 13 on the first region 11 is different from an etch loading of the etching process on the fin material layer 13 on the second region 12. The etch loading difference causes heights 'h' of the formed fins 16 and widths 'w' of the formed fins 16 to be different. The fin closer to the second region 12 has a smaller height 'h' and a smaller width 'w'.

Figure 3:
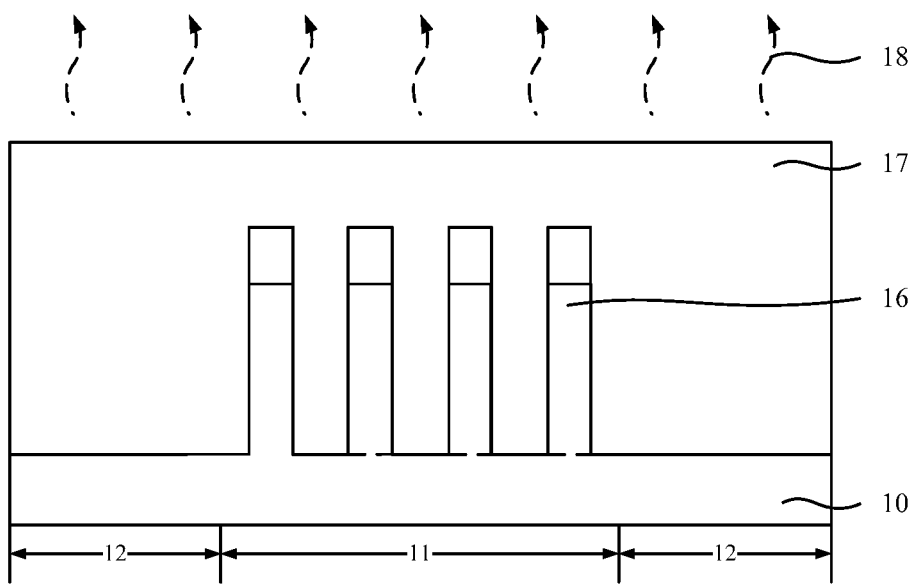
Figure 4:
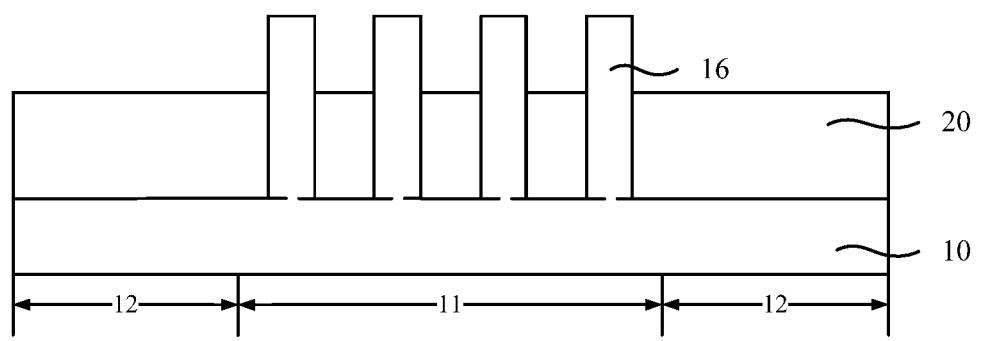

In addition, referring to FIGS. 3-4, after forming the fins 16, an isolation structure 20 is formed on the substrate 10 exposed by the fins 16. For example, forming the isolation structure 20 includes: forming a dielectric layer 17 (illustrated in FIG. 3) on the first region 11 and on the second region 12; and referring to FIG. 4, removing a thickness portion of the dielectric layer 17 along a direction perpendicular to a surface of the substrate 10 to expose a sidewall portion of the fin 16 to form the isolation structure 20.

To ensure a gap between adjacent fins 16 to be sufficiently filled by the dielectric layer 17 and to avoid the formation of voids, forming the dielectric layer 17 often includes a fluid vapor deposition process. For example, forming the dielectric layer 17 includes: forming a flowable precursor layer on the first region 11 and on the second region 12; and curing the precursor layer by an annealing treatment 18 to form the dielectric layer 17.

The precursor layer is often made of a flowable oxygenated compound. When curing the precursor layer by the annealing treatment 18, a portion of sidewall material of the fin 16 reacts with the precursor layer. That is, oxygen atoms in the precursor layer will diffuse into the fin 16, such that a thickness portion of the sidewall material of the fin 16 is oxidized to be converted into a sacrificial layer (not illustrated) similar to the dielectric layer 17.

Moreover, fin is not formed on the second region 12, and, thus, a width of the precursor layer on the second region 12 is greater than a width of the precursor layer on the first region 11. Therefore, in the fin 16 closest to the second region 12, sufficiently large amount of sidewall material facing toward the second region 12 is oxidized, that is, a thickness of the formed sacrificial layer is sufficiently large. Sufficiently small amount of sidewall material opposing to the second region 12 in the fin 16 closest to the second region 12 and sidewall material in the fin 16 away from the second region 12 is oxidized, that is, the thickness of the formed sacrificial layer is sufficiently small.

Because the sidewall material of the fin 16 is oxidized to form a material similar to the dielectric layer 17, when removing the dielectric layer 17 to expose the sidewall portion of the fin 16, the sacrificial layer will be removed together with the dielectric layer 17. Therefore, after forming the isolation structure 20, the one or more fins 16 exposed by the isolation structure 20 have non-uniform thickness.

Regardless of the etch loading issue of the etching process for forming the fins and the oxidation issue for forming the isolation structure, the formed fins have non-uniform height or thickness. Therefore, the quality of the formed fins is affected, and the performance of the formed semiconductor structure is degraded.

The present disclosure provides a semiconductor structure and fabrication method thereof. One or more sacrificial fins may be formed on a blank region of a substrate to increase a density of semiconductor structures on the blank region of the substrate. Therefore, an etch loading difference issue when forming the sacrificial fins and active fins may be improved, the height and width uniformity of the active fins and the sacrificial fins may be improved, and the performance of the formed semiconductor structure may be improved.

Figure 14:
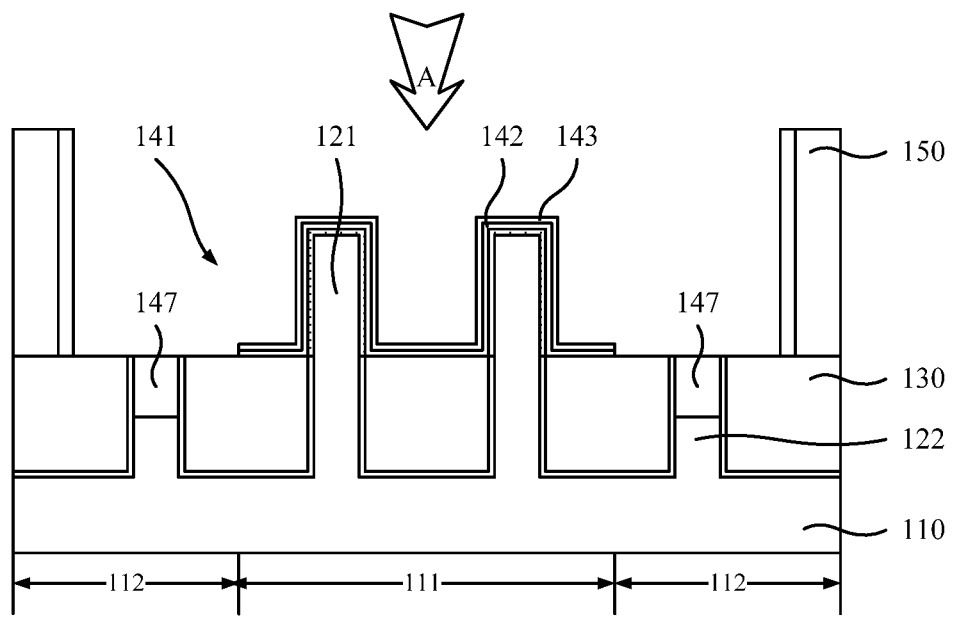
Figure 15:
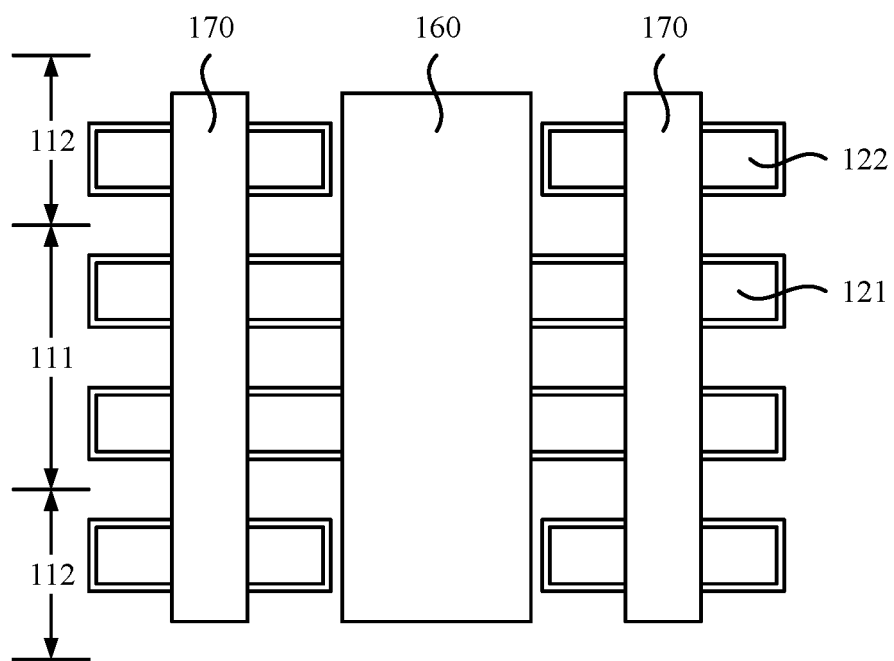
Figure 16:
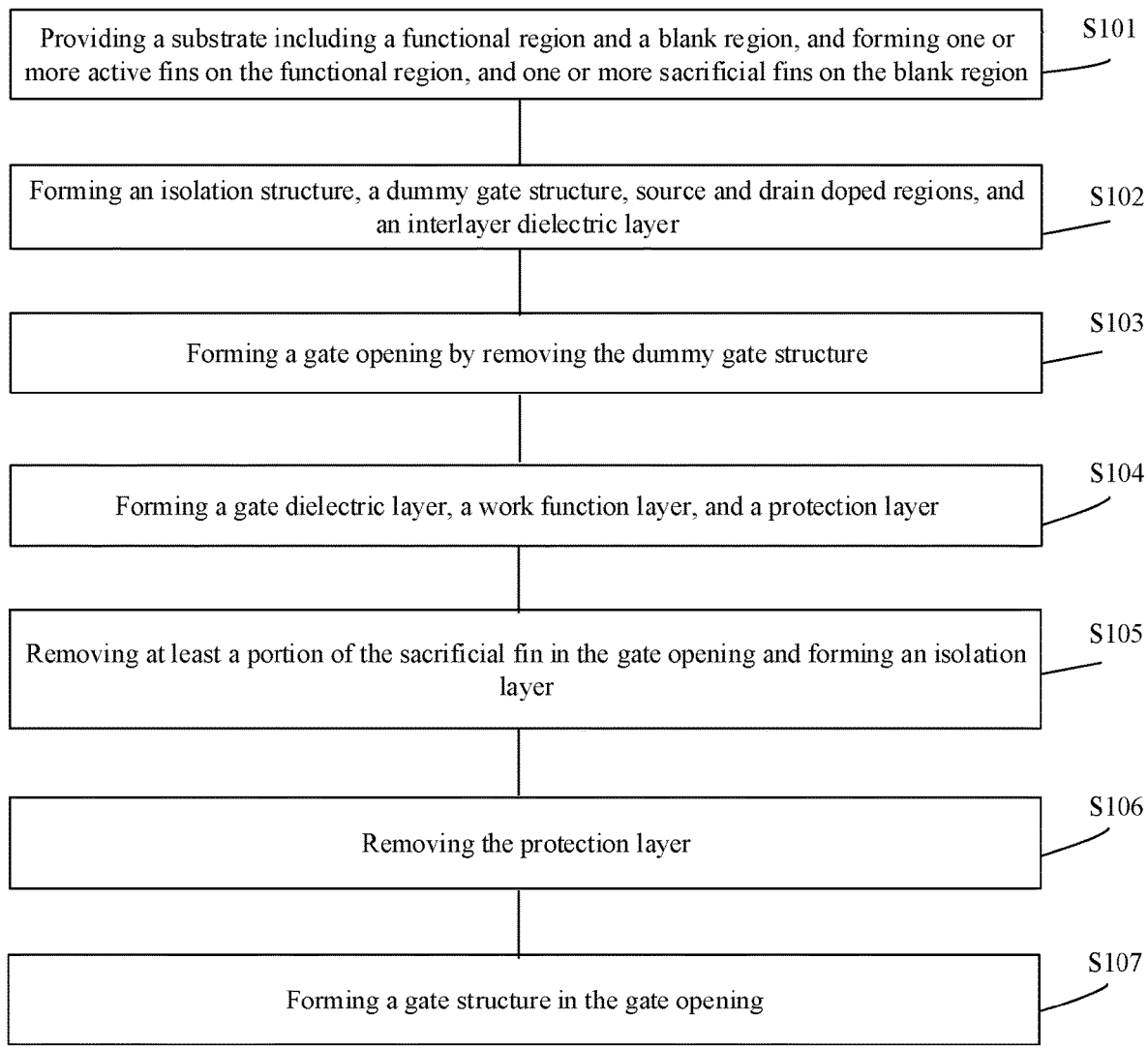
FIG. 16 illustrates an exemplary fabrication method for forming a semiconductor structure consistent with various disclosed embodiments of the present disclosure.

FIG. 16 illustrates an exemplary fabrication method for forming a semiconductor structure consistent with various disclosed embodiments of the present disclosure; and FIGS. 5-15 illustrate semiconductor structures corresponding to certain stages of the exemplary fabrication method.

Figure 5:
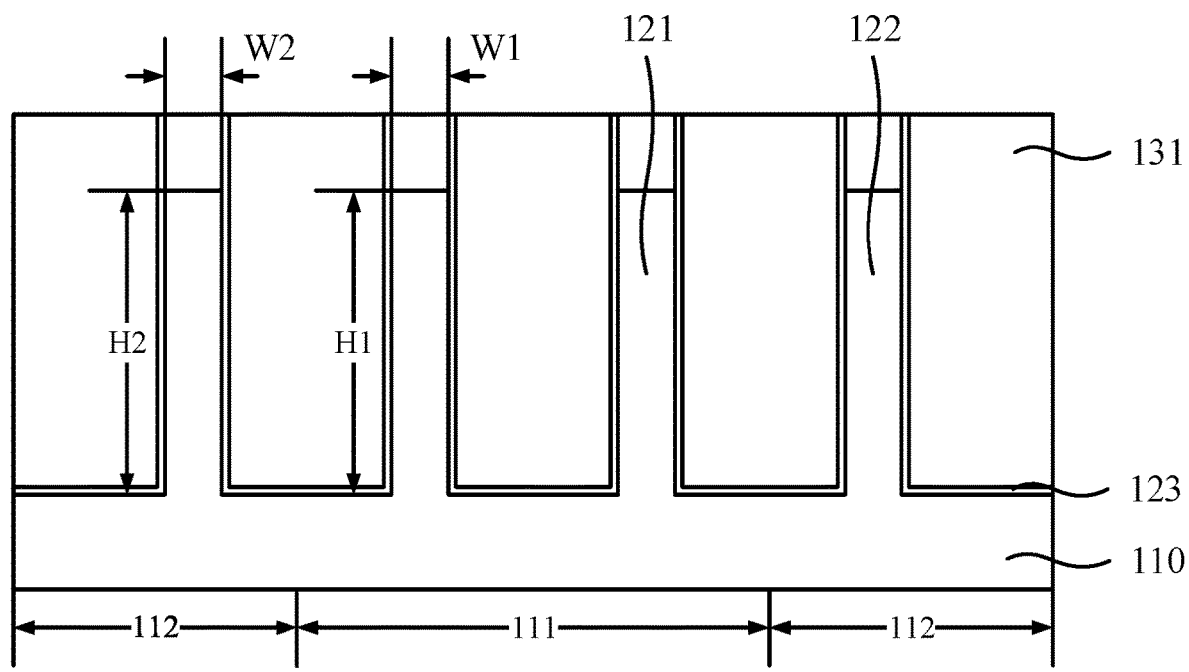
FIGS. 5-15 illustrate semiconductor structures corresponding to certain stages for forming an exemplary semiconductor structure consistent with various disclosed embodiments of the present disclosure.

As shown in FIG. 16, at the beginning of the fabrication method, one or more active fins and one or more sacrificial fins may be formed on a substrate (S101). FIG. 5 illustrates a corresponding semiconductor structure.

Referring to FIG. 5, a substrate 110 may be provided. The substrate 110 may include a functional region 111 and a blank region 112. One or more active fins 121 may be formed on the functional region 111 of the substrate 110, and one or more sacrificial fins 122 may be formed on the blank region 112 of the substrate 110. The substrate 110 may provide a process operation platform for subsequent processes and may provide mechanical support in the semiconductor structure.

The functional region 111 of the substrate 110 may be used to form a fin field effect transistor (FinFET), and the blank region 112 of the substrate 110 may not be used to form a FinFET. The blank region 112 and the functional region 111 may be disposed adjacent to each other.

In one embodiment, the number of the blank regions 112 may be two, and the two blank regions 112 may be disposed on different sides of the functional region 111, respectively. In another embodiment, the substrate may include one blank region disposed adjacent to the functional region. In certain embodiments, the substrate may include a plurality of functional regions and a plurality of blank regions. The functional regions and the blank regions may be alternatively arranged.

The active fin 121 may provide a channel for the formed semiconductor structure. The sacrificial fins 122 may increase a density of semiconductor structures on the blank region 112 of the substrate 110 to improve an etch loading issue during the formation of the active fins 121.

The formed sacrificial fins 122 may increase the density of the semiconductor structures on the blank region 112 of the substrate 110. Thus, when forming the active fins 121 and the sacrificial fins 122, the functional region 111 may have a similar etch loading as the blank region 112, and, the active fins 121 and the sacrificial fins 122 may have desired height and width uniformity. Therefore, the uniformity of the active fins 121 may be improved, and the performance of the formed semiconductor structure may be improved.

In one embodiment, referring to FIG. 5, the sacrificial fin 122 may have a same height as the active fin 121. That is, along a direction perpendicular to a surface of the substrate 110, a dimension 112' of the sacrificial fin 122 may be equal to a dimension 'H1' of the active fin 121. The sacrificial fin 122 may have a same width as the active fin 121. That is, in a plane parallel to the surface of the substrate 110, along a direction perpendicular to a length direction of one of the sacrificial fin 122 and the active fin 121, a dimension 'W2' of the sacrificial fin 122 may be equal to a dimension 'W1' of the active fin 121.

In one embodiment, the number of the sacrificial fins 122 on the blank region 112 of the substrate 110 may be one, and a spacing between the sacrificial fin 122 and an adjacent active fin 121 may be equal to a spacing between adjacent active fins 121. In another embodiment, when the number of the sacrificial fins on the blank region is two or more, the spacing between the sacrificial fin and the adjacent active fin may be equal to the spacing between the adjacent active fins, and a spacing between adjacent sacrificial fins may be equal to the spacing between the adjacent active fins.

The height and width of the sacrificial fin 122 may be configured to be equal to the height and width of the active fin 121, and the spacing between the sacrificial fin 122 and the adjacent active fin 121 may be configured to be equal to the spacing between the adjacent active fins 121. Therefore, the density of the semiconductor structures on the blank region 112 of the substrate 110 may be close to the density of the semiconductor structures on the functional region 111 of the substrate 110 as much as possible, and, the etch loading for forming the active fins 121 may tend to be the same as the etch loading for forming the sacrificial fins 122. The height and width uniformity of the sacrificial fins 122 and the active fins 121 may be effectively improved, and the occurrence probability of a size difference phenomenon in the active fins 121 may be effectively reduced. Thus, the uniformity of the active fins 121 may be improved, and the performance of the formed semiconductor structure may be improved.

In one embodiment, the substrate 110 may be made of monocrystalline silicon. In another embodiment, the substrate may be made of polysilicon, amorphous silicon, amorphous germanium, germanium, silicon germanium, silicon carbide, gallium arsenide, or indium gallium, etc. In certain embodiments, the substrate may be made of a silicon on insulator (SOI) substrate, a germanium on insulator (GOI) substrate, a glass substrate, and other types of substrates. The substrate may be made of materials adaptable to process requirements and easy for integration.

In one embodiment, the active fin 121 and the sacrificial fin 122 may be made of a same material as the substrate 110. The active fin 121, the sacrificial fin 122, and the substrate 110 may be made of monocrystalline silicon. In another embodiment, the active fin and the sacrificial fin may be made of a material different from the substrate. The active fin and the sacrificial fin may be made of amorphous germanium, germanium, silicon germanium, silicon carbide, gallium arsenide, or indium gallium, etc.

In one embodiment, when providing the substrate 110, a fin material layer may be formed on the substrate 110. Forming the active fins 121 and the sacrificial fins 122 may include: forming a plurality of discrete fin mask layers on a surface of the fin material layer; and removing a portion of the fin material layer by etching the fin material layer using the fin mask layers as a mask, to enable the remaining fin material layer to form the active fins 121 and the sacrificial fins 122 protruding on the surface of the substrate 110.

Because the sacrificial fin 122 has to be formed on the blank region 112 of the substrate 110, the fin mask layers may not only be formed over the functional region 111 of the substrate 110, but also be formed over the blank region 112 of the substrate 110. Moreover, because the size and spacing of the sacrificial fins 122 are the same as the size and spacing of the active fins 121, size and spacing of the fin mask layers over the blank region 112 may be equal to size and spacing of the fin mask layers over the functional region 111. That is, the fin mask layers may be uniformly distributed on the surface of the fin material layer. Therefore, when etching the fin material layer, the etch loading of the etching process on the fin material layer over the blank region 112 may be close to the etch loading of the etching process on the fin material layer over the functional region 111. That is, the etching process may uniformly etch the fin material layer. Therefore, the formed active fins 121 and the sacrificial fins 122 may have desired height and width uniformity.

In one embodiment, the fin mask layers may not only define the size and positions of the active fin 121 and the sacrificial fin 122, but also be used as a stop layer of a planarization process in subsequent processes to protect the tops of the active fin 121 and the sacrificial fin 122. Therefore, after forming the active fin 121 and the sacrificial fin 122, the fin mask layers may be retained.

In addition, after forming the active fin 121 and the sacrificial fin 122, a linear oxide layer 123 may be formed on sidewall surfaces of the active fin 121 and the sacrificial fin 122. In one embodiment, because the fin mask layers are formed on the active fin 121 and the sacrificial fin 122, the linear oxide layer 123 may cover sidewall surfaces of the fin mask layers and the surface of the substrate 110.

Figure 6:
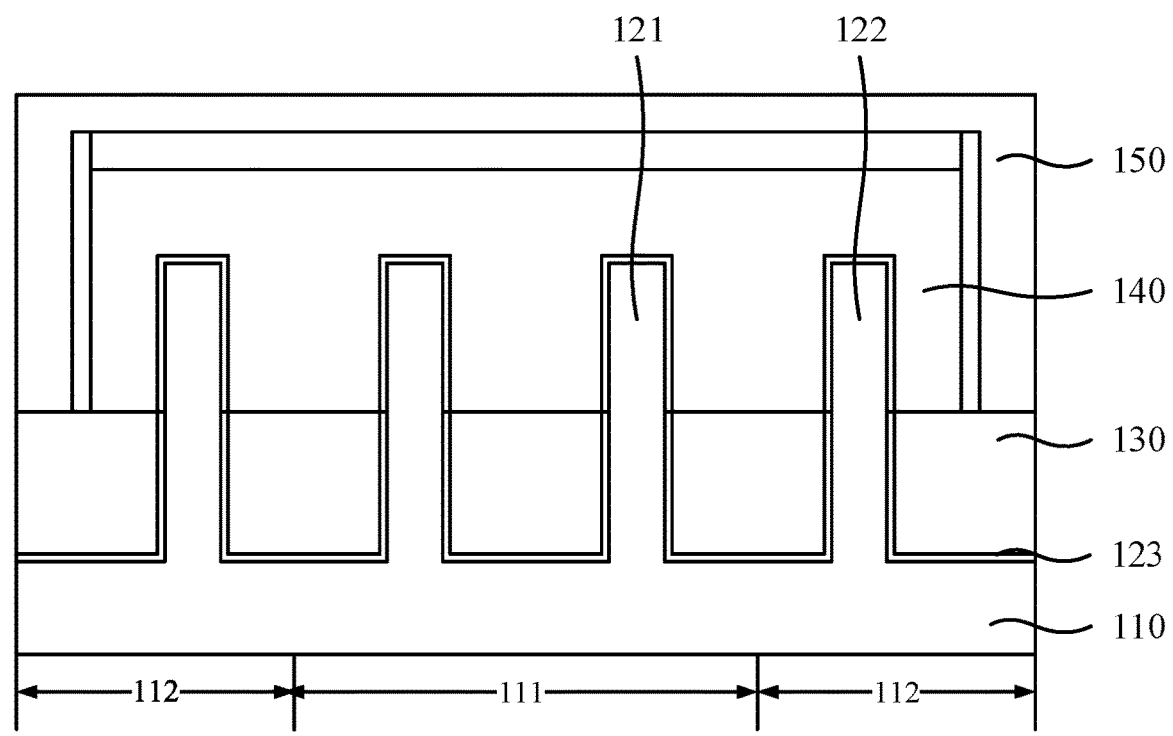
Figure 7:
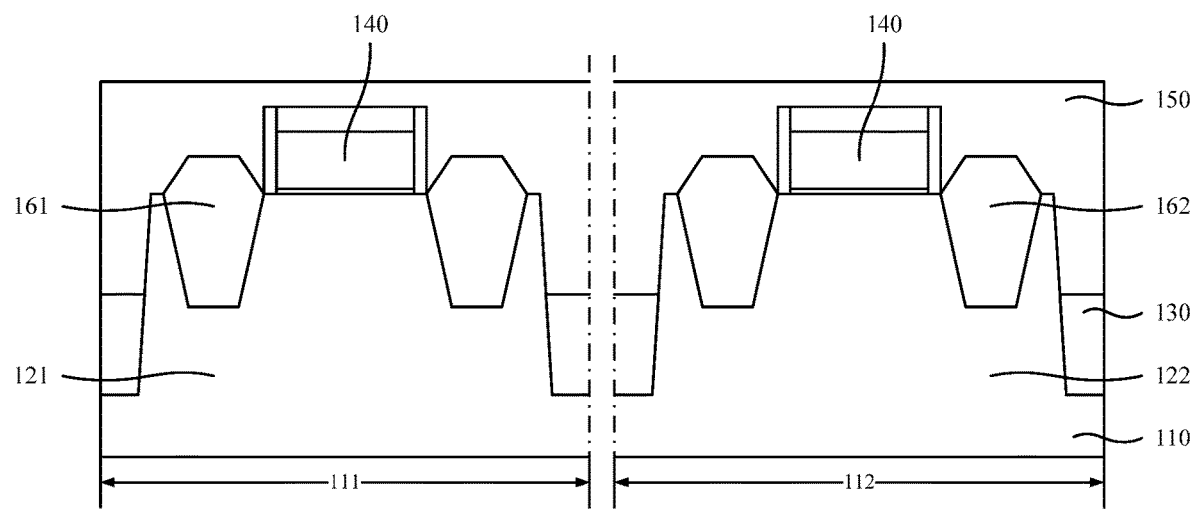

Returning to FIG. 16, after forming the active fin and the sacrificial fin on the substrate, an isolation structure, a dummy gate structure, source and drain doped regions, and an interlayer dielectric layer may be formed (S102). FIGS. 6-7 illustrate corresponding semiconductor structures. FIG. 7 illustrates a cross-sectional view along length portions of the active fin 121 and the sacrificial fin 122 illustrated in FIG. 6.

Referring to FIGS. 6-7, after forming the active fin 121 and the sacrificial fin 122 on the substrate 110, an isolation structure 130 may be formed on both the functional region 111 and the blank region 112 of the substrate 110. The isolation structure 130 may expose a sidewall portion of the active fin 121 and a sidewall portion of the sacrificial fin 122.

The isolation structure 130 may electrically isolate adjacent semiconductor structures. The isolation structure 130 may partially cover the sidewall of the active fin 121 and the sidewall of the sacrificial fin 122, and a top of the isolation structure 130 may be lower than a top of one of the active fin 121 and the sacrificial fin 122.

Forming the isolation structure 130 may include forming a dielectric material layer 131 (illustrated in FIG. 5) on the substrate 110 exposed by the active fin 121 and the sacrificial fin 122. The dielectric material layer 131 may sufficiently fill gaps between the adjacent active fins 121 and sacrificial fins 122, and a top of the dielectric material layer 131 may be above the top of one of the active fin 121 and the sacrificial fin 122. Forming the isolation structure 130 may also include removing a thickness portion of the dielectric material layer 131 along a direction perpendicular to the surface of the substrate 110 to expose the sidewall portion of the active fin 121 and the sidewall portion of the sacrificial fin 122 to form the isolation structure 130.

As the integration degree of the semiconductor structure increases, the difficulty of forming the isolation structure 130 may gradually increase. To enable the isolation structure 130 to sufficiently fill the gap between the adjacent active fins 121 and to avoid the formation of voids, in one embodiment, forming the dielectric material layer 131 may include a flowable chemical vapor deposition process.

In one embodiment, forming the dielectric material layer 131 may include forming a precursor layer on the substrate 110 exposed by the active fin 121 and the sacrificial fin 122 by a spin coating process; and curing the precursor layer by performing an annealing process on the precursor layer to form the dielectric material layer 131.

The precursor layer may be usually made of an oxygenated compound. When performing the annealing process on the precursor layer, oxygen atoms in the precursor layer may diffuse into the active fin 121 and the sacrificial fin 122 to oxidize a portion of sidewall material of the active fin 121 and a portion of sidewall material of the sacrificial fin 122.

In one embodiment, the active fins 121 may have a density close to the sacrificial fins 122, such that the precursor layer between the adjacent active fins 121 may have a same thickness from a sidewall surface of one of the active fin 121 and the sacrificial 122 as the precursor layer between the adjacent sacrificial fins 122. Therefore, the oxidized portion of sidewall material of the active fin 121 may have a same thickness as the oxidized portion of sidewall material of the sacrificial fin 122, and a remaining portion of the active fin 121 may have a same thickness as a remaining portion of the sacrificial fin 122. Thus, the active fin 121 and the sacrificial fin 122 exposed by the isolation structure 130 formed by partially removing the dielectric material layer 131 may have desired thickness uniformity, the uniformity of the active fins 121 may be effectively improved, and the performance of the formed semiconductor structure may be improved.

Referring back to FIGS. 6-7, after forming the isolation structure 130, a dummy gate structure 140 may be formed. The dummy gate structure 140 may be across length portions of the active fin 121 and the sacrificial fin 122. The dummy gate structure 140 may occupy a space for subsequently forming a gate structure of the formed semiconductor structure.

In one embodiment, the dummy gate structure 140 may be a stacked-layer structure. The dummy gate structure 140 may include a dummy oxide layer (not labeled) and a dummy gate electrode (not labeled) on the dummy oxide layer. In one embodiment, the dummy gate structure 140 may be across the length portions of the active fin 121 and the sacrificial fin 122, and may cover a portion of each of top and sidewall surfaces of the active fin 121 and a portion of each of top and sidewall surfaces of the sacrificial fin 122. Therefore, the dummy oxide layer and the dummy gate electrode may be across the length portions of the active fin 121 and the sacrificial fin 122, and may cover the portion of each of top and sidewall surfaces of the active fin 121 and the portion of each of top and sidewall surfaces of the sacrificial fin 122. In another embodiment, the dummy gate structure may be a single-layer structure. Correspondingly, the dummy gate structure may include a dummy gate layer.

In one embodiment, forming the dummy gate structure 140 may include forming an oxidized material layer on the substrate 110, forming a dummy gate material layer on the oxidized material layer, and forming a gate mask layer (not labeled) on a surface of the dummy gate material layer. Forming the dummy gate structure 140 may also include etching the dummy gate material layer using the gate mask layer as a mask to expose the oxidized material layer to form the dummy gate layer on the oxidized material layer. The dummy gate layer may be across the length portions of the active fin 121 and the sacrificial fin 122, and may cover the portion of each of top and sidewall surfaces of the active fin 121 and the portion of each of top and sidewall surfaces of the sacrificial fin 122. Further, forming the dummy gate structure 140 may include removing the oxidized material layer exposed by the dummy gate layer to expose the surfaces of the active fin 121 and the sacrificial fin 122, thereby the remaining oxidized material layer covered by the dummy gate layer may be used as the dummy oxide layer.

Referring back to FIG. 7, after forming the dummy gate structure 140, source and drain doped regions (not labeled) may be formed in the active fin 121 on both sides of the dummy gate structure 140. The source and drain doped region may be used to form one of a source region and a drain region of the formed semiconductor structure.

In one embodiment, forming the source and drain doped region may include forming a first epitaxial layer 161 in the active fin 121 on both sides of the dummy gate structure 140, and forming a second epitaxial layer 162 in the sacrificial fin 122 on both sides of the dummy gate structure 140.

The first epitaxial layer 161 may be used to apply stress on the channel of the formed semiconductor structure to increase mobility of carriers in the channel of the formed semiconductor structure. The second epitaxial layer 162 may increase an area of the source and drain doped region to reduce a contact resistance of the source and drain doped region.

The second epitaxial layer 162 and the first epitaxial layer 161 may be formed through a same one process, and, thus, the second epitaxial layer 162 and the first epitaxial layer 161 may be made of a same material and may be doped with same dopant ions. In one embodiment, the semiconductor structure may be used to form a PMOS transistor, and, thus, the source and drain doped region may be a P-type source and drain doped region. The first epitaxial layer 161 may be made of silicon germanium or silicon, and the first epitaxial layer 161 may be doped with P-type dopant ions, such as B, Ga, or In, etc. The second epitaxial layer 162 may also be made of silicon germanium or silicon, and the second epitaxial layer 162 may be doped with P-type dopant ions, such as B, Ga, or In, etc.

In another embodiment, the semiconductor structure may be used to form an NMOS transistor, and, thus, the source and drain doped region may be an N-type source and drain doped region. The first epitaxial layer 161 may be made of silicon carbon or silicon, and the first epitaxial layer 161 may be doped with N-type dopant ions, such as P, As, or Sb, etc. The second epitaxial layer 162 may also be made of silicon carbon or silicon, and the second epitaxial layer 162 may be doped with N-type dopant ions, such as P, As, or Sb, etc.

In one embodiment, the second epitaxial layer 162 and the first epitaxial layer 161 may have a sufficiently large volume, and the second epitaxial layer 162 and the first epitaxial layer 161 may be in contact with each other to be merged into a single piece. Therefore, the size of the source and drain doped region may be expanded, which may facilitate reduction of the contact resistance of the source and drain doped region, and facilitate improving the performance of the formed semiconductor structure.

Referring back to FIGS. 6-7, an interlayer dielectric layer 150 may be formed to fill a gap between adjacent dummy gate structures 140. The interlayer dielectric layer 150 may electrically isolate adjacent semiconductor structures.

In one embodiment, the interlayer dielectric layer 150 may be made of silicon oxide. In another embodiment, the interlayer dielectric layer 150 may be made of silicon nitride, silicon oxynitride, or other suitable dielectric material(s).

Referring back to FIGS. 6-7, forming the interlayer dielectric layer 150 may include filling the gap between the adjacent dummy gate structures 140 with a dielectric material, where the dielectric material may have a top above the dummy gate structure 140; and removing a thickness portion of the dielectric material to expose the top of the dummy gate structure 140.

Figure 8:
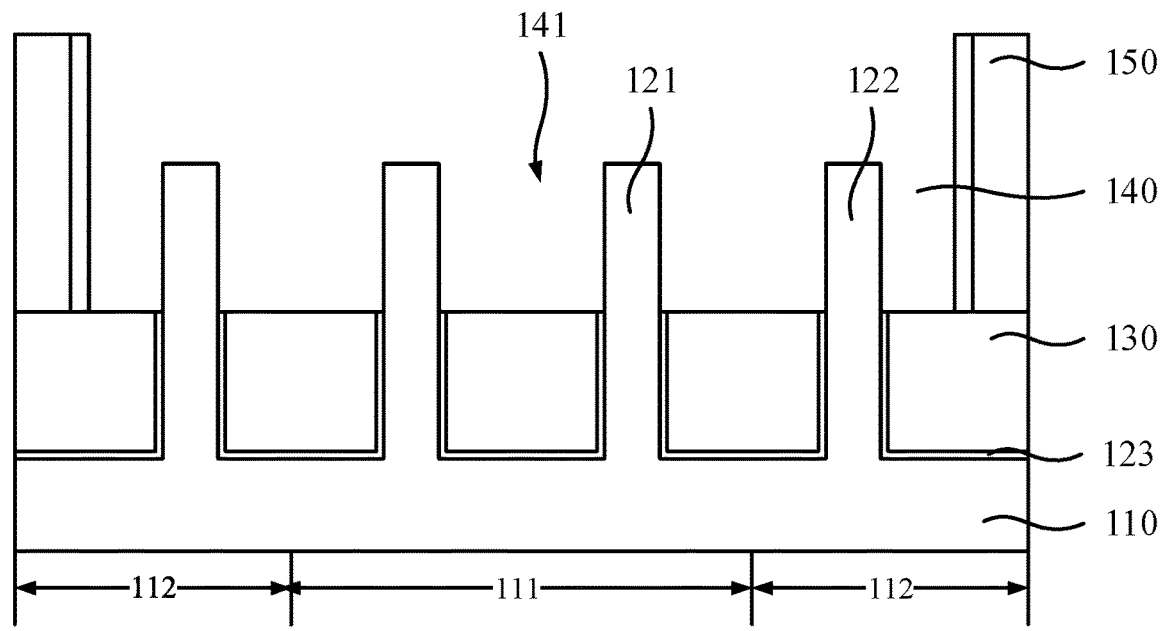

Returning to FIG. 16, after forming the interlayer dielectric layer, a gate opening may be formed (S103). FIG. 8 illustrates a corresponding semiconductor structure.

Referring to FIG. 8, a gate opening 141 may be formed in the interlayer dielectric layer 150 by removing the dummy gate structure 140 (illustrated in FIGS. 6-7). The gate opening 141 may expose the portion of each of the top and the sidewall surfaces of the active fin 121 and the portion of each of the top and the sidewall surfaces of the sacrificial fin 122. The removal of the dummy gate structure 140 (illustrated in FIGS. 6-7) may provide process space for the formation of a subsequent gate structure.

In one embodiment, the dummy gate structure 140 may include the dummy oxide layer and the dummy gate electrode. For example, forming the gate opening 141 may include removing the dummy gate electrode and the dummy oxide layer. In addition, the dummy gate structure 140 may be across the length portions of the active fin 121 and the sacrificial fin 122, and, thus, a bottom of the gate opening 141 may expose the portion of each of the top and the sidewall surfaces of the active fin 121 and the portion of each of the top and the sidewall surfaces of the sacrificial fin 122. That is, the active fin 121 and the sacrificial fin 122 may be protruded on the bottom of the gate opening 141.

Figure 9:
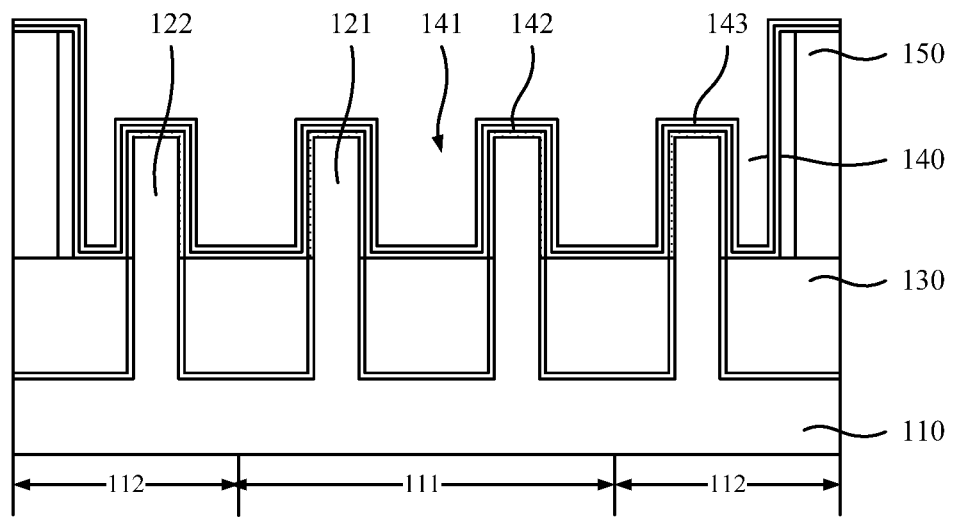
Figure 10:
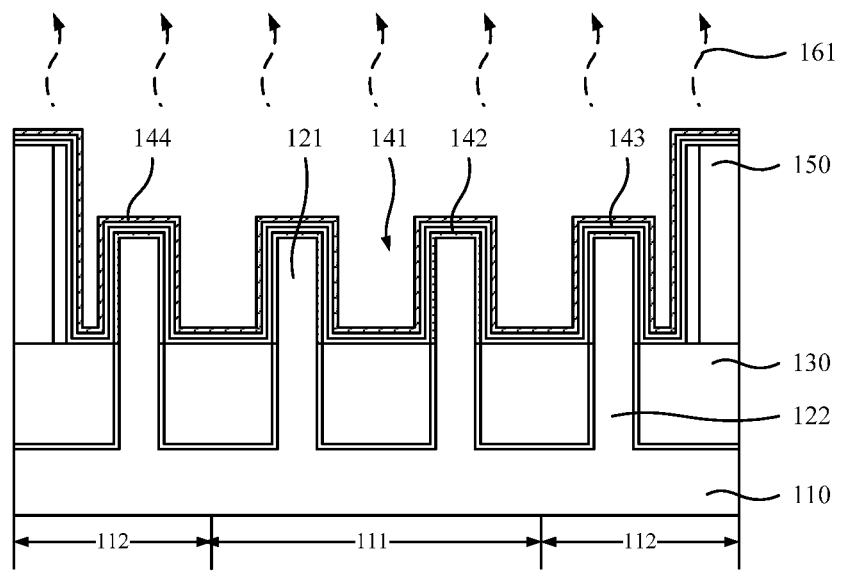

Returning to FIG. 16, after forming the gate opening, a gate dielectric layer, a work function layer, and a protection layer may be formed (S104). FIGS. 9-10 illustrate corresponding semiconductor structures.

Referring to FIGS. 9-10, after forming the gate opening 141, a gate dielectric layer 142 may be formed in the gate opening 140. The gate dielectric layer 142 may at least cover the portion of each of the top and the sidewall of the active fin 121. A work function layer 143 may be formed on the gate dielectric layer 142, and a protection layer 144 may be formed on the work function layer 143.

The gate dielectric layer 142 may electrically isolate the formed gate structure and the channel region of the formed semiconductor structure. In one embodiment, the formed gate structure may be a metal gate structure. Therefore, the gate dielectric layer 142 may include an oxide layer (not labeled) and a high-K dielectric layer on the oxide layer.

The oxide layer may be used as an interface layer, and may provide a desired surface for the formation of the high-K dielectric layer. The high-K dielectric layer may be made of a gate dielectric material having a relative dielectric constant greater than the relative dielectric constant of silicon oxide. The gate dielectric material may include one or more of hafnium oxide, zirconium oxide, lanthanum oxide, aluminum oxide, titanium oxide, strontium titanate, lanthanum aluminum oxide, yttrium oxide, hafnium oxynitride, zirconium oxynitride, lanthanum oxynitride, aluminum oxynitride, titanium oxynitride, titanium strontium oxynitride, lanthanum aluminum oxynitride, and yttrium oxynitride.

The active fin 121 and the sacrificial fin 122 may be protruded on the bottom of the gate opening 141. The gate dielectric layer 142 may cover the portion of each of the top and sidewall surfaces of the active fin 121 and the portion of each of the top and sidewall surfaces of the sacrificial fin 122. In addition, referring to FIG. 9, the gate dielectric layer 142 may also cover the isolation structure 130 exposed at the bottom of the gate opening 141, a sidewall of the gate opening 141, and the top of the interlayer dielectric layer 150.

The work function layer 143 may adjust a work function of the formed metal gate structure to adjust a threshold voltage of the formed semiconductor structure. In one embodiment, the formed semiconductor structure may be used to form a PMOS, and, thus, the work function layer 143 may be a P-type work function layer. Therefore, the work function layer 143 may be made of a material having a work function value in a range of approximately 5.1 eV-5.5 eV, e.g., 5.2 eV, 5.3 eV, or 5.4 eV, etc. The work function layer 143 may be made of one or more of TiN, TaN, TaSiN, and TiSiN.

In another embodiment, the formed semiconductor structure may be used to form an NMOS, and, thus, the work function layer may be an N-type work function layer. Therefore, the work function layer 143 may be made of a material having a work function value in a range of approximately 3.9 eV-4.5 eV, e.g., 4 eV, 4.1 eV, or 4.3 eV, etc. The work function layer may be made of one or more of TiAl, TiAlC, TaAlN, TiAlN, TaCN, and AlN.

The protection layer 144 may protect the work function layer 143 and the gate dielectric layer 142 in subsequent processes. Referring to FIG. 10, in one embodiment, after forming the protection layer 144, a densification annealing treatment 161 may be performed on the gate dielectric layer 142. The densification annealing treatment 161 may increase a material density of the oxide layer in the gate dielectric layer 142, and, thus, the quality of the gate dielectric layer 142 may be effectively improved. The protection layer 144 may protect the work function layer 143 and the gate dielectric layer 142 during the densification annealing treatment 161. In particular, the high-K dielectric layer and the work function layer 143 may be effectively prevented from being oxidized during the densification annealing treatment 161, thereby facilitating improvement of the performance of the formed semiconductor structure.

In one embodiment, the protection layer 144 may be made of amorphous silicon. The removal of amorphous silicon may be simple and may have less residue. Therefore, use of amorphous silicon for the protection layer 144 may effectively reduce the influence of the protection layer 144 on the formed semiconductor structure.

In one embodiment, a thickness of the protection layer 144 may be in a range of approximately 50 Å-300 Å. The thickness of the protection layer 144 cannot be too large nor too small. When the thickness of the protection layer 144 is too small, the protection function of the protection layer 144 may be affected, and the quality of the formed gate dielectric layer 142 and the work function layer 143 may not be ensured. When the thickness of the protection layer 144 is too large, materials may be wasted, and process difficulty may increase.

Figure 11:
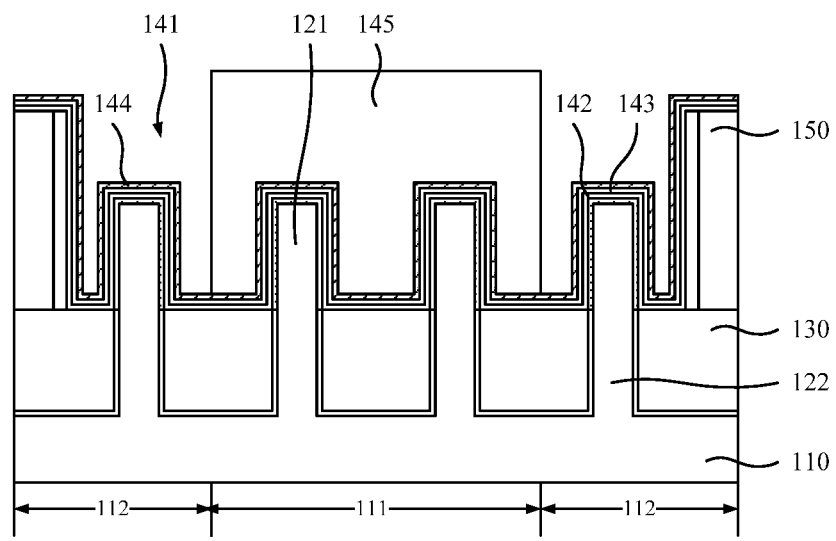
Figure 12:
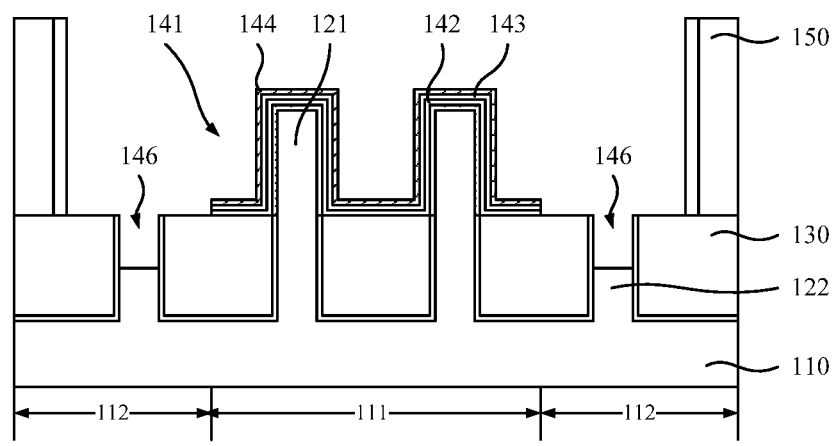
Figure 13:
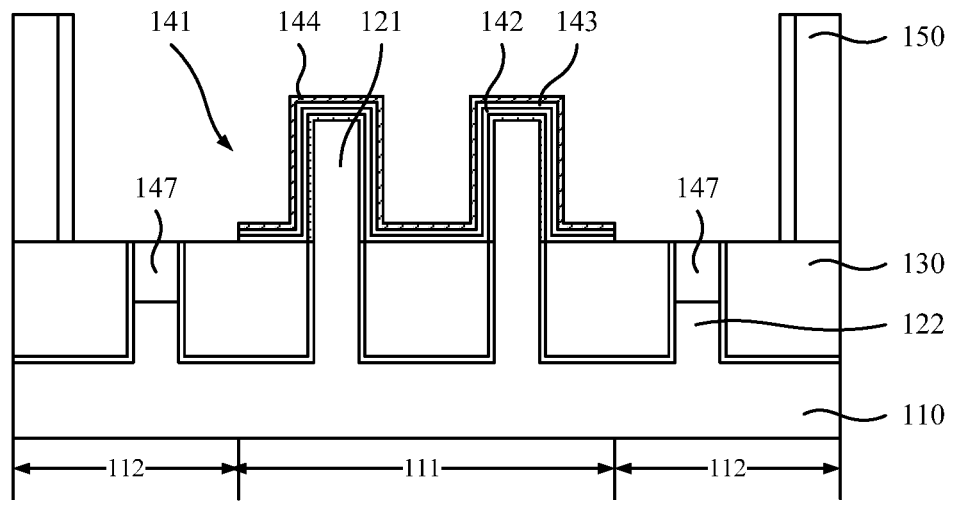

Returning to FIG. 16, after forming the protection layer, at least a portion of the sacrificial fin may be removed and an isolation layer may be formed (S105). FIGS. 11-13 illustrate corresponding semiconductor structures.

Referring to FIGS. 11-13, at least a portion of the sacrificial fin 122 in the gate opening 141 may be removed. The removal of at least the portion of the sacrificial fin 122 in the gate opening 141 may effectively reduce the probability of forming a channel in the sacrificial fin 122 to facilitate the suppression of a leakage current.

In addition, the portion of the sacrificial fin 122 may be removed after forming the protection layer 144, such that the protection layer 144 may still have the protection function when removing the portion of the sacrificial fin 122. Thus, the probability that the work function layer 143 and the gate dielectric layer 142 are damaged may be effectively reduced to facilitate ensuring the performance of the formed semiconductor structure. Moreover, removing the portion of the sacrificial fin 122 after forming the protection layer 144 may use the protection layer in the densification annealing treatment 161 to effectively reduce the formation of a mask layer, which may facilitate simplification of the process and control of the process cost.

Removing at least the portion of the sacrificial fin 122 may include forming a removal mask 145 (illustrated in FIG. 11) on the functional region 111 of the substrate 110; and referring to FIG. 12, removing at least a height portion of the sacrificial fin 122 along a direction perpendicular to the surface of the substrate 110 by etching using the removal mask 145 as a mask.

The removal mask 145 may protect the active fin 121, and the gate dielectric layer 142 and the work function layer 143 over the active fin 121. In one embodiment, the removal mask 145 may be made of a photoresist. Forming the removal mask 145 may include a spin coating process, and exposure and development processes.

Removing the height portion of the sacrificial fin 122 by etching may enable a remaining portion of the sacrificial fin 122 to be coplanar with or lower than the bottom of the gate opening 141. Thus, a channel may be prevented from being formed in the sacrificial fin 122, and the leakage current of the formed semiconductor structure may be effectively suppressed. In one embodiment, the bottom of the gate opening 141 may partially expose the isolation structure 130, and, thus, a top of the remaining portion of the sacrificial fin 122 may be coplanar with or lower than the top of the isolation structure 130.

In one embodiment, a height of the removed portion of the sacrificial fin 122 may be greater than a height of the sacrificial fin 122 in the gate opening 141. That is, the height of the removed portion of the sacrificial fin 122 may be greater than the height of the sacrificial fin 122 protruded on the bottom of the gate opening 141, such that the top of the remaining portion of the sacrificial fin 122 may be lower than the top of the isolation structure 130. Referring to FIG. 12, removing the portion of the sacrificial fin 122 may include forming an isolation trench 146 in the gate opening 141 by removing the height portion of the sacrificial fin 122.

Removing the height portion of the sacrificial fin 122 greater than the sacrificial fin 122 protruded on the bottom of the gate opening 141 may ensure the entire sacrificial fin 122 in the gate opening 141 to be removed. Thus, a distance between a subsequently formed gate structure and the remaining portion of the sacrificial fin 122 may effectively increase, and the subsequently formed gate structure may be prevented from being in contact with the sacrificial fin 122 as much as possible. Therefore, the probability of forming a channel in the sacrificial fin 122 may be effectively reduced, which may facilitate the suppression of the leakage current.

In one embodiment, a depth of the isolation trench 146 may be in a range of approximately 200 Å-500 Å. The depth of the isolation trench 146 cannot be too large nor too small. When the depth of the isolation trench 146 is too small, the distance between the subsequently formed gate structure and the remaining portion of the sacrificial fin 122 may not effectively increase, the probability of forming a channel in the sacrificial fin 122 may not be reduced, and the leakage current may not be effectively suppressed. When the depth of the isolation trench 146 is too large, the process difficulty and process time of the etching process may increase, unnecessary process risks may raise, and the probability that the substrate 110 is damaged may increase, thereby the manufacturing yield and device performance may not be improved.

In one embodiment, the gate dielectric layer 142, the work function layer 143, and the protection layer 144 may also be formed on the sacrificial fin 122. Therefore, when removing the height portion of the sacrificial fin 122, the gate dielectric layer 142, the work function layer 143, and the protection layer 144 over the blank region 112, on the sidewall of the gate opening 141, and on the top of the interlayer dielectric layer 150 may be removed together.

To avoid the formation of voids and to isolate the subsequently formed gate structure and the remaining portion of the sacrificial fin 122, in one embodiment, referring to FIG. 13, after forming the isolation trench 146 (illustrated in FIG. 12), an isolation layer 147 may be formed to fill the isolation trench 146.

The isolation layer 147 may sufficiently fill the isolation trench 146, to avoid the formation of voids and to ensure the reliability of the formed semiconductor structure. The isolation layer 147 may also isolate the subsequently formed gate structure and the remaining portion of the sacrificial fin 122, reduce the probability of forming a channel in the sacrificial fin 122, and suppress the leakage current of the formed semiconductor structure.

In one embodiment, the isolation layer 147 may be made of silicon oxide. Forming the isolation layer 147 to fill the isolation trench 146 may include an atomic layer deposition process. As the integration degree increases, both the gate opening 141 and the sacrificial fin 122 may have a small size, thus, the gate opening 141 and the isolation trench 146 may have a sufficiently small size, and the process difficulty for sufficiently filling the isolation trench 146 may be large. Therefore, forming the isolation layer 147 by an atomic layer deposition process may effectively improve a gap-filling capability of the isolation layer 147, ensure the isolation trench 146 to be sufficiently filled, effectively reduce the probability of the formation of the voids, and facilitate improvement of the performance of the formed semiconductor structure.

In one embodiment, a thickness of the isolation layer 147 may be equal to the depth of the isolation trench 146. That is, the thickness of the isolation layer 147 may be in a range of approximately 200 Å-500 Å. Therefore, a top of the isolation layer 147 may be coplanar with the bottom of the gate opening 141. In one embodiment, the gate opening 141 may partially expose the isolation structure 130, and, thus, the top of the isolation layer 147 may be coplanar with the top of the isolation structure 130. Therefore, an isolation distance between the subsequently formed gate structure and the remaining portion of the sacrificial fin 122 may be ensured, which may prevent the occurrence of leakage current issue, and bridging issue, etc.

Returning to FIG. 16, after forming the isolation layer, the protection layer may be removed (S106). FIG. 14 illustrates a corresponding semiconductor structure.

Referring to FIG. 14, after removing at least the portion of the sacrificial fin 122 in the gate opening 141, the protection layer 144 (illustrated in FIG. 13) may be removed. The removal of the protection layer 144 may be used to expose the work function layer 143 and may provide a process platform for the formation of a subsequent gate structure.

In one embodiment, the protection layer 144 may be an amorphous silicon layer, and removing the protection layer 144 may include a wet etching process. For example, process parameters for removing the protection layer 144 may include the following. An etching solution may be NH$_4$OH:H$_2$O with a solution concentration in a range of approximately 1:10-20:1, a process temperature may be in a range of approximately 25° C.-80° C., and a process time may be in a range of approximately 2 min-100 min.

Returning to FIG. 16, after removing the protection layer, a gate structure may be formed (S107). FIG. 15 illustrates a corresponding semiconductor structure. FIG. 15 illustrates a top-view schematic along a direction 'A' in FIG. 14.

Referring to FIG. 15, after removing at least the portion of the sacrificial fin 122 in the gate opening 141 and removing the protection layer 144, a gate structure 160 may be formed in the gate opening 141.

After removing the protection layer 144, a gate electrode may be formed in the gate opening 141. The gate dielectric layer 142, the work function layer 143, and the gate electrode may form the gate structure 160. In one embodiment, the gate structure 160 may be a metal gate structure, and, thus, the gate electrode may be made of a metal, e.g., tungsten.

After forming the gate structure 160, an interconnection structure 170 may be formed on the source and drain doped region for connecting with an external circuit. In one embodiment, the interconnection structure 170 may be electrically connected to the first epitaxial layer 161 in the active fin 122 on both sides of the gate structure 160, and the interconnection structure 170 may also extend to the remaining sacrificial fin 122. Therefore, the interconnection structure 170 may be connected to the second epitaxial layer 162 in the remaining sacrificial fin 122 on both sides of the gate structure 170, such that a heat dissipation issue of the formed semiconductor structure may be effectively improved, and the contact resistance of the source and drain doped region of the formed semiconductor structure may be reduced.

Accordingly, the present disclosure also provides a semiconductor structure. FIGS. 14-15 illustrate structural schematics of the semiconductor structure. FIG. 15 illustrates a top-view schematic along a direction 'A' in FIG. 14. Referring to FIGS. 14-15, the semiconductor structure may include a substrate 110. The substrate 110 may include a functional region 111 and a blank region 112. One or more active fins 121 may be formed on the functional region 111 of the substrate 110, and one or more sacrificial fins 122 may be formed on the blank region 112 of the substrate 110. A height of the sacrificial fin 122 may be lower than a height of the active fin 121. The semiconductor structure may also include a gate structure 160 (illustrated in FIG. 15). The gate structure 160 may be formed on the active fin 121 and over the sacrificial fin 122, and may be across a length portion of the active fin 121. The substrate 110 may provide a process operation platform for subsequent processes and may provide mechanical support in the semiconductor structure.

The functional region 111 of the substrate 110 may be used to form a fin field effect transistor (FinFET), and the blank region 112 of the substrate 110 may not be used to form a FinFET. The blank region 112 and the functional region 111 may be disposed adjacent to each other.

In one embodiment, the number of the blank regions 112 may be two, and the two blank regions 112 may be disposed on both sides of the functional region 111, respectively. In another embodiment, the substrate may include one blank region disposed adjacent to the functional region. In certain embodiments, the substrate may include a plurality of functional regions and a plurality of blank regions. The functional regions and the blank regions may be alternatively arranged.

The active fin 121 may provide a channel of the formed semiconductor structure. The sacrificial fins 122 may increase a density of semiconductor structures on the blank region 112 of the substrate 100 to improve an etch loading issue during the formation of the active fins 121.

The formed sacrificial fins 122 may increase the density of the semiconductor structures on the blank region 112 of the substrate 110. Thus, when forming the active fins 121 and the sacrificial fins 122, the functional region 111 may have a similar etch loading as the blank region 112, and, the active fins 121 and the sacrificial fins 122 may have desired height and width uniformity. Therefore, the uniformity of the active fins 121 may be improved, and the performance of the formed semiconductor structure may be improved.

Forming the sacrificial fin 122 having the height lower than the active fin 121 may effective prevent the gate structure 160 from being in contact with the sacrificial fin 122, increase a distance between the gate structure 160 and the sacrificial fin 122, and reduce the probability of forming a channel in the sacrificial fin 122. Therefore, a leakage current may be effectively suppressed, and the performance of the semiconductor structure may be improved.

In one embodiment, referring to FIG. 5, the sacrificial fin 122 may have a same width as the active fin 121. That is, in a plane parallel to a surface of the substrate 110, along a direction perpendicular to a length direction of one of the sacrificial fin 122 and the active fin 121, a dimension 'W2' of the sacrificial fin 122 may be equal to a dimension 'W1' of the active fin 121.

In one embodiment, the number of the sacrificial fins 122 on the blank region 112 of the substrate 110 may be one, and a spacing between the sacrificial fin 122 and an adjacent active fin 121 may be equal to a spacing between adjacent active fins 121. In another embodiment, when the number of the sacrificial fins on the blank region is two or more, the spacing between the sacrificial fin and the adjacent active fin may be equal to the spacing between the adjacent active fins, and a spacing between adjacent sacrificial fins may be equal to the spacing between the adjacent active fins.

The width of the sacrificial fin 122 may be configured to be equal to the width of the active fin 121, and the spacing between the sacrificial fin 122 and the adjacent active fin 121 may be configured to be equal to the spacing between the adjacent active fins 121. Therefore, the density of the semiconductor structures on the blank region 112 of the substrate 110 may be close to the density of the semiconductor structures on the functional region 111 of the substrate 110 as much as possible, and, the etch loading for forming the active fins 121 may tend to be the same as the etch loading for forming the sacrificial fins 122. The width uniformity of the sacrificial fins 122 and the active fins 121 may be effectively improved, and the occurrence probability of a size difference phenomenon in the active fins 121 may be effectively reduced. Thus, the uniformity of the active fins 121 may be improved, and the performance of the formed semiconductor structure may be improved.

In one embodiment, the substrate 110 may be made of monocrystalline silicon. In another embodiment, the substrate may be made of polysilicon, amorphous silicon, amorphous germanium, germanium, silicon germanium, silicon carbide, gallium arsenide, or indium gallium, etc. In certain embodiments, the substrate may be made of a silicon on insulator (SOI) substrate, a germanium on insulator (GOI) substrate, a glass substrate, and other types of substrates. The substrate may be made of materials adaptable to process requirements and easy for integration.

In one embodiment, the active fin 121 and the sacrificial fin 122 may be made of a same material as the substrate 110. The active fin 121, the sacrificial fin 122, and the substrate 110 may be made of monocrystalline silicon. In another embodiment, the active fin and the sacrificial fin may be made of a material different from the substrate. The active fin and the sacrificial fin may be made of amorphous germanium, germanium, silicon germanium, silicon carbide, gallium arsenide, or indium gallium, etc.

In one embodiment, the semiconductor may further include an isolation structure 130 on both the functional region 111 and the blank region 112 of the substrate 110. A top of the isolation structure 130 may be lower than a top of the active fin 121, and a top of the sacrificial fin 122 may be lower than the top of the isolation structure 130. The isolation structure 130 may electrically isolate adjacent semiconductor structures.

The isolation structure 130 may cover a sidewall portion of the active fin 121 and a sidewall portion of the sacrificial fin 122, and the top of the isolation structure 130 may be lower than the top of the active fin 121 and above the top of the sacrificial fin 122.

The formation of the sacrificial fins 122 may prevent a non-uniform thickness issue of the active fins due to diffusion of oxygen atoms during the formation of the isolation structure 130, such that high quality active fins 121 may be obtained, facilitating improving the performance of the formed semiconductor structure.

In one embodiment, the top of the sacrificial fin 122 may be lower than the top of the isolation structure 130. The semiconductor structure may further include an isolation layer 147 disposed between the sacrificial fin 122 and the gate structure 160 (illustrated in FIG. 15).

The isolation layer 147 may avoid the formation of voids to ensure the reliability of the formed semiconductor structure. The isolation layer 147 may also isolate the gate structure 160 and the sacrificial fin 122, reduce the probability of forming a channel in the sacrificial fin 122, and suppress the leakage current of the formed semiconductor structure. In one embodiment, the isolation layer 147 may be made of silicon oxide. A thickness of the isolation layer 147 may be in a range of approximately 200 Å-500 Å

The thickness of the isolation layer 147 cannot be too large nor too small. When the thickness of the isolation layer 147 is too small, the distance between the gate structure 160 and the sacrificial fin 122 may not effectively increase, the probability of forming a channel in the sacrificial fin 122 may not be reduced, and the leakage current may not be effectively suppressed. When the thickness of the isolation layer 147 is too large, unnecessary process risks may raise, the probability that the substrate 110 is damaged may increase, and the manufacturing yield and device performance may not be improved.

The top of the isolation layer 147 may be coplanar with the top of the isolation structure 130. Therefore, an isolation distance between the gate structure 160 and the sacrificial fin 122 may be ensured, which may prevent the occurrence of leakage current issue, and bridging issue, etc.

The gate structure 160 may be a gate structure of the semiconductor structure, and may be used to control turned-on and turned-off of the channel of the semiconductor structure. In one embodiment, the gate structure 160 may be a metal gate structure. The gate structure 160 may include a gate dielectric layer 142, a work function layer 143 and a gate electrode (not illustrated) successively formed on the active fin 121.

The gate dielectric layer 142 may electrically isolate the gate structure 160 and the channel region of the semiconductor structure. In one embodiment, the gate structure may be a metal gate structure. Therefore, the gate dielectric layer 142 may include an oxide layer (not labeled) and a high-K dielectric layer on the oxide layer.

The oxide layer may be used as an interface layer, and may provide a desired surface for the formation of the high-K dielectric layer. The high-K dielectric layer may be made of a gate dielectric material having a relative dielectric constant greater than the relative dielectric constant of silicon oxide. The gate dielectric material may include one or more of hafnium oxide, zirconium oxide, lanthanum oxide, aluminum oxide, titanium oxide, strontium titanate, lanthanum aluminum oxide, yttrium oxide, hafnium oxynitride, zirconium oxynitride, lanthanum oxynitride, aluminum oxynitride, titanium oxynitride, titanium strontium oxynitride, lanthanum aluminum oxynitride, and yttrium oxynitride.

The active fin 121 may be protruded on the top of the isolation structure 130. The gate dielectric layer 142 may cover a portion of each of the top and sidewall surfaces of the active fin 121. In addition, referring to FIG. 9, the gate dielectric layer 142 may also cover a portion of the isolation structure 130.

The work function layer 143 may adjust a work function of the metal gate structure to adjust a threshold voltage of the semiconductor structure. In one embodiment, the semiconductor structure may be used to form a PMOS, and, thus, the work function layer 143 may be a P-type work function layer. Therefore, the work function layer 143 may be made of a material having a work function value in a range of approximately 5.1 eV-5.5 eV, e.g., 5.2 eV, 5.3 eV, or 5.4 eV, etc. The work function layer 143 may be made of one or more of TiN, TaN, TaSiN, and TiSiN.

In another embodiment, the semiconductor structure may be used to form an NMOS, and, thus, the work function layer may be an N-type work function layer. Therefore, the work function layer 143 may be made of a material having a work function value in a range of approximately 3.9 eV-4.5 eV, e.g., 4 eV, 4.1 eV, or 4.3 eV, etc. The work function layer may be made of one or more of TiAl, TiAlC, TaAlN, TiAlN, TaCN, and AlN.

The gate electrode may connect the gate structure 160 to an external circuit. In one embodiment, the gate structure 160 may be a metal gate structure, and, thus, the gate electrode may be made of a metal, e.g., tungsten.

In one embodiment, the semiconductor structure may further include a first epitaxial layer 161 (illustrated in FIG. 7) in the active fin 121 on both sides of the gate structure 160 (illustrated in FIG. 15), and a second epitaxial layer 162 (illustrated in FIG. 7) in the sacrificial fin 122 on both sides of the gate structure 160 (illustrated in FIG. 15).

The first epitaxial layer 161 may form a source and drain doped region of the semiconductor structure, and may apply stress on the channel of the semiconductor structure to increase mobility of carriers in the channel. The second epitaxial layer 162 may increase an area of the source and drain doped region to reduce a contact resistance of the source and drain doped region.

The second epitaxial layer 162 and the first epitaxial layer 161 may be formed through a same one process, and, thus, the second epitaxial layer 162 and the first epitaxial layer 161 may be made of a same material and may be doped with same dopant ions. In one embodiment, the semiconductor structure may be used to form a PMOS transistor, and, thus, the source and drain doped region may be a P-type source and drain doped region. The first epitaxial layer 161 may be made of silicon germanium or silicon, and the first epitaxial layer 161 may be doped with P-type dopant ions, such as B, Ga, or In, etc. The second epitaxial layer 162 may also be made of silicon germanium or silicon, and the second epitaxial layer 162 may be doped with P-type dopant ions, such as B, Ga, or In, etc.

In another embodiment, the semiconductor structure may be used to form an NMOS transistor, and, thus, the source and drain doped region may be an N-type source and drain doped region. The first epitaxial layer 161 may be made of silicon carbon or silicon, and the first epitaxial layer 161 may be doped with N-type dopant ions, such as P, As, or Sb, etc. The second epitaxial layer 162 may also be made of silicon carbon or silicon, and the second epitaxial layer 162 may be doped with N-type dopant ions, such as P, As, or Sb, etc.

In one embodiment, the second epitaxial layer 162 and the first epitaxial layer 161 may have a sufficiently large volume, and the second epitaxial layer 162 and the first epitaxial layer 161 may be in contact with each other to be merged into a single piece. Therefore, the size of the source and drain doped region may be expanded, which may facilitate reduction of the contact resistance of the source and drain doped region, and facilitate improving the performance of the formed semiconductor structure.

In one embodiment, the disclosed semiconductor structure may be formed by the disclosed method for forming a semiconductor structure. Therefore, other beneficial effects of the semiconductor structure may be referred to the foregoing disclosed method for forming a semiconductor structure.

Accordingly, through forming the sacrificial fins on the blank region of the substrate, the sacrificial fins may increase the density of the semiconductor structures on the blank region of the substrate. Thus, when forming the active fins and the sacrificial fins, the functional region may have the similar etch loading as the blank region. Therefore, the active fins and the sacrificial fins may have desired height and width uniformity, which may facilitate improving the uniformity of the active fins, and facilitate improving the performance of the formed semiconductor structure.

After forming the active fin and the sacrificial fin on the substrate and before forming the dummy gate structure, the isolation structure may be formed on the functional region and the blank region of the substrate. The sacrificial fin may be removed after removing the dummy gate structure. That is, the isolation structure may be formed before removing the sacrificial fin. When forming the isolation structure, the formation of the isolation fin may effectively improve the non-uniform width issue of the active fins due to different oxidation degree subjected to the sidewall portions of the active fins. The uniformity of the active fins may be effectively improved, and the performance of the formed semiconductor structure may be improved.

The sacrificial fin may have the same height and width as the active fin, and the spacing between the adjacent sacrificial fins may be equal to the spacing between the adjacent active fins. Thus, the active fins on the functional layer may have the same density as the sacrificial fins on the blank region, and the etch loading for forming the active fins may be close to the etch loading for forming the sacrificial fins. Therefore, the active fins and the sacrificial fins may have desired height and width uniformity, which may facilitate improving the uniformity of the active fins, and facilitate improving the performance of the formed semiconductor structure.

The height of the removed portion of the sacrificial fin may be greater than the height of the sacrificial fin in the gate opening. That is, the height of the removed portion of the sacrificial fin may be greater than the height of the sacrificial fin protruded on the bottom of the gate opening. The isolation trench may be formed at the bottom of the gate opening after removing the portion of the sacrificial fin, and the isolation layer may be formed to fill the isolation trench. The formation of the isolation layer may effective increase the distance between the gate structure and the remaining portion of the sacrificial fin, and reduce the probability of forming a channel in the sacrificial fin, which may facilitate control of the leakage current of the semiconductor structure, and facilitate improving the performance of the formed semiconductor structure.

The gate structure may be the metal gate structure. After forming the gate opening and before removing the portion of the sacrificial fin, the gate dielectric layer, the work function layer, and the protection layer may be successively formed in the gate opening. The protection layer may be removed after removing the portion of the sacrificial fin in the gate opening and before forming the gate structure. After forming the protection layer and before removing at least the portion of the sacrificial fin in the gate opening, the densification annealing treatment may be performed on the gate dielectric layer. The protection layer may protect the work function layer and the gate dielectric layer during the densification annealing treatment, and may prevent the work function layer and the gate dielectric layer from being damaged. The protection layer may protect the work function layer and the gate dielectric layer when removing the portion of the sacrificial fin in the gate opening. Therefore, removing the portion of the sacrificial fin after forming the protection layer may effectively reduce the formation of a mask layer, which may facilitate simplifying the process and reducing the process cost.

After forming the dummy gate structure and before forming the interlayer dielectric layer, source and drain doped regions may be formed. Forming the source and drain doped regions may include forming the first epitaxial layer and the second epitaxial layer in the active fin and the sacrificial fin on both sides of the dummy gate structure, respectively. Because the sacrificial fin is removed after removing the dummy gate structure, the removed portion of the sacrificial fin may be a portion covered by the dummy gate structure. That is, the second epitaxial layer in the sacrificial fin may be retained after forming the gate structure, and the gate structure may not be able to form a channel in the sacrificial fin. Therefore, the second epitaxial layer in a same one sacrificial fin may not be used as the source and drain doped regions and may not have electrical function. In addition, through process control, the first epitaxial layer and the second epitaxial layer may be in contact with each other, such that the size of the source and drain doped region of the semiconductor structure may be expanded, which may facilitate reduction of the contact resistance of the source and drain doped region, and facilitate improvement of the performance of the formed semiconductor structure.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A method for fabricating a semiconductor structure, comprising:
   providing a substrate, including a functional region and a blank region;
   forming one or more active fins on the functional region of the substrate, and one or more sacrificial fins on the blank region of the substrate;
   forming a dummy gate structure, across length portions of each active fin and each sacrificial fin;
   forming an interlayer dielectric layer to fill a gap between adjacent dummy gate structures;
   forming a gate opening in the interlayer dielectric layer by removing the dummy gate structure, wherein the gate opening exposes a portion of each of top and sidewall surfaces of the active fin, and a portion of each of top and sidewall surfaces of the sacrificial fin;
   removing at least a portion of the sacrificial fin in the gate opening to form an isolation trench in the gate opening by removing a height portion of the sacrificial fin along a direction perpendicular to a surface of the substrate;
   forming an isolation layer on a remaining portion of the sacrificial fin to fill the isolation trench in the blank region; and
   forming a gate structure in the gate opening after removing the portion of the sacrificial fin in the gate opening.

2. The method according to claim 1, wherein:
   the sacrificial fin has a same width as the active fin.

3. The method according to claim 1, wherein:
   the sacrificial fin has a same height as the active fin.

4. The method according to claim 1, wherein:
   a spacing between adjacent sacrificial fins is equal to a spacing between adjacent active fins.

5. The method according to claim 1, wherein:
   a spacing between the sacrificial fin and an adjacent active fin is equal to a spacing between adjacent active fins.

6. The method according to claim 1, wherein:
   a height of a removed portion of the sacrificial fin is greater than a height of the sacrificial fin in the gate opening.

7. The method according to claim 1, wherein:
   forming the isolation layer to fill the isolation trench includes an atomic layer deposition process.

8. The method according to claim 1, wherein a thickness of the isolation layer is in a range of approximately 200 Å-500 Å.

9. The method according to claim 1, after forming the dummy gate structure and before removing at least the portion of the sacrificial fin in the gate opening, further including:
   forming a gate dielectric layer in the gate opening, wherein the gate dielectric layer covers at least the portion of each of the top and sidewall surfaces of the active fin;
   forming a work function layer on the gate dielectric layer;
   forming a protection layer on the work function layer;
   removing the protection layer after removing the portion of the sacrificial fin in the gate opening and before forming the gate structure; and
   forming a gate electrode in the gate opening after removing the protection layer, wherein the gate dielectric layer, the work function layer and the gate electrode form the gate structure.

10. The method according to claim 9, after forming the protection layer and before removing at least the portion of the sacrificial fin in the gate opening, further including:
    performing a densification annealing treatment on the gate dielectric layer.

11. The method according to claim 9, wherein:
    the protection layer is made of amorphous silicon.

12. The method according to claim 1, after forming the dummy gate structure and before forming the interlayer dielectric layer, further including:
    forming source and drain doped regions in the active fin on both sides of the dummy gate structure.

13. The method according to claim 12, wherein forming the source and drain doped regions includes:
    forming a first epitaxial layer in the active fin on both sides of the dummy gate structure, and a second epitaxial layer in the sacrificial fin on both sides of the dummy gate structure.

14. The method according to claim 13, wherein:
    an interconnection structure is formed on the source and drain doped region in the active fin to connect with an external circuit, and
    the interconnection structure is electrically connected to the first epitaxial layer in the active fin and the second epitaxial layer in the sacrificial fin.

15. The method according to claim 1, after providing the substrate and before forming the dummy gate structure, further including:
    forming an isolation structure on the functional region and the blank region of the substrate, wherein the isolation structure exposes portions of sidewall surfaces of the active fin and the sacrificial fin.

16. The method according to claim 1, wherein:
    the isolation layer is directly on the remaining portion of the sacrificial fin,
    a bottom surface of the isolation trench is lower than a bottom surface of the gate opening, and
    a top surface of the isolation layer is coplanar with the bottom surface of the gate opening.

* * * * *